United States Patent [19]

Piccone et al.

[11] Patent Number: 5,757,037
[45] Date of Patent: May 26, 1998

[54] POWER THYRISTOR WITH MOS GATED TURN-OFF AND MOS-ASSISED TURN-ON

[75] Inventors: Dante E. Piccone, Glenmoore; Harshad Mehta, Paoli, both of Pa.

[73] Assignee: Silicon Power Corporation, Malvern, Pa.

[21] Appl. No.: 381,766

[22] Filed: Feb. 1, 1995

[51] Int. Cl.$^6$ .............................. H01L 29/74; H01L 31/111
[52] U.S. Cl. ...................... 257/147; 257/148; 257/151; 257/153; 257/162; 257/133; 257/138
[58] Field of Search ........................ 257/147, 148, 257/151, 152, 153, 162, 138, 133, 135

[56] References Cited

U.S. PATENT DOCUMENTS

| | | | |
|---|---|---|---|
| 4,717,940 | 1/1988 | Shinohe et al. | 357/38 |
| 4,958,211 | 9/1990 | Temple et al. | 357/38 |
| 5,350,934 | 9/1994 | Matsuda | 257/139 |
| 5,350,935 | 9/1994 | Temple | 257/147 |
| 5,442,220 | 8/1995 | Arai | 257/378 |
| 5,449,939 | 9/1995 | Horiguchi et al. | 257/360 |
| 5,485,022 | 1/1996 | Matsuda | 257/133 |

FOREIGN PATENT DOCUMENTS 3209171   8/1988   Japan ................................ 257/152

OTHER PUBLICATIONS

Temple et al, MOS–Controlled Thyristor (MCT) Power Switches, Power Conversion Intelligent Motion, Nov. 1992, pp. 9–16.

*Primary Examiner*—Wael Fahmy
*Assistant Examiner*—Fetsum Abraham
*Attorney, Agent, or Firm*—William Freedman; Joseph H. Yamaoka

[57] ABSTRACT

The power thyristor of this invention has a cellular emitter structure. Each cell also has a FET assisted turn-on gate integrated into the cell. A turn-on gate voltage of one polarity is applied to a FET gate element that overlies the surface of the cell and to the turn-on gate integrated into the cell. When this voltage is so applied, a channel underlying the FET gate element becomes conductive, which allows the integrated turn-on gate to provide drive to the upper base-upper emitter junction of the thyristor cell thereby turning the thyristor cell on.

9 Claims, 2 Drawing Sheets

5,757,037

1

POWER THYRISTOR WITH MOS GATED TURN-OFF AND MOS-ASSISED TURN-ON

TECHNICAL FIELD

This invention relates to power thyristors and more particularly to power thyristors utilizing a field-effect assisted turn-on gate and a field-effect turn-off gate, both controlled from a single gate electrode.

BACKGROUND

One type of power thyristor is the MOS Controlled Thyristor (MCT) as described in the publication Power Conversion Intelligent Motion (November 1992), pp. 9–16, Temple et al. The MCT uses Field Effect Transistors (FET's) to control both the turn-on and turn-off of the power thyristor from a single gate electrode. In the MCT, the p-n junction of the thyristor at the intersection of the lower emitter and the lower base of the thyristor extends across the entire plane of the thyristor body. In the MCT, both the upper base and the upper emitter of the power thyristor have an arrayed cellular construction. Each cell of the MCT has an upper base region that extends into the lower base region from the upper surface of the thyristor body and an upper emitter region that extends into the upper base region from the upper surface of the thyristor body. Because the upper base region is formed on a cellular basis, the p-n junction formed by the upper base and the lower base for each cell terminates at the upper surface of the thyristor body. In other words, the junction formed by the upper base and lower base for the power thyristor is not continuous within the thyristor.

U.S. Pat. Nos. 4,717,940—Shinohe et al. and 4,958,211—Temple disclose a power thyristor having a cellular upper emitter structure in which both the p-n junction formed at the intersection of the lower emitter region with the lower base region, and the p-n junction formed at the intersection of the upper base region with the lower base region, extend continuously across the plane of the thyristor body.

It is one object of this invention to provide a power thyristor having a cellular emitter structure in which each cell includes a FET assisted turn-on gate.

It is another object of this invention to provide a power thyristor having a cellular emitter structure wherein an emitter cell that has been turned off can assist the turn-off of other still-conducting emitter cells.

SUMMARY OF THE INVENTION

The power thyristor of this invention has a cellular emitter structure. Each cell also has a FET assisted turn-on gate integrated into the cell. A turn-on gate voltage of one polarity is applied to a FET gate element which overlies the surface of the cell and to the turn-on gate integrated into the cell. A channel underlying the FET turn-on gate element becomes conductive which allows the integrated turn-on gate to provide drive to the upper base-upper emitter junction of the thyristor cell, thereby turning the thyristor cell on.

BRIEF DESCRIPTION OF THE DRAWINGS

While the specification concludes with claims particularly pointing out and distinctly claiming that which is regarded as the present invention, the objects and advantages of this invention can be more readily ascertained from the following description of preferred embodiments when read in conjunction with the accompanying drawings, in which:

2

Figure 1:
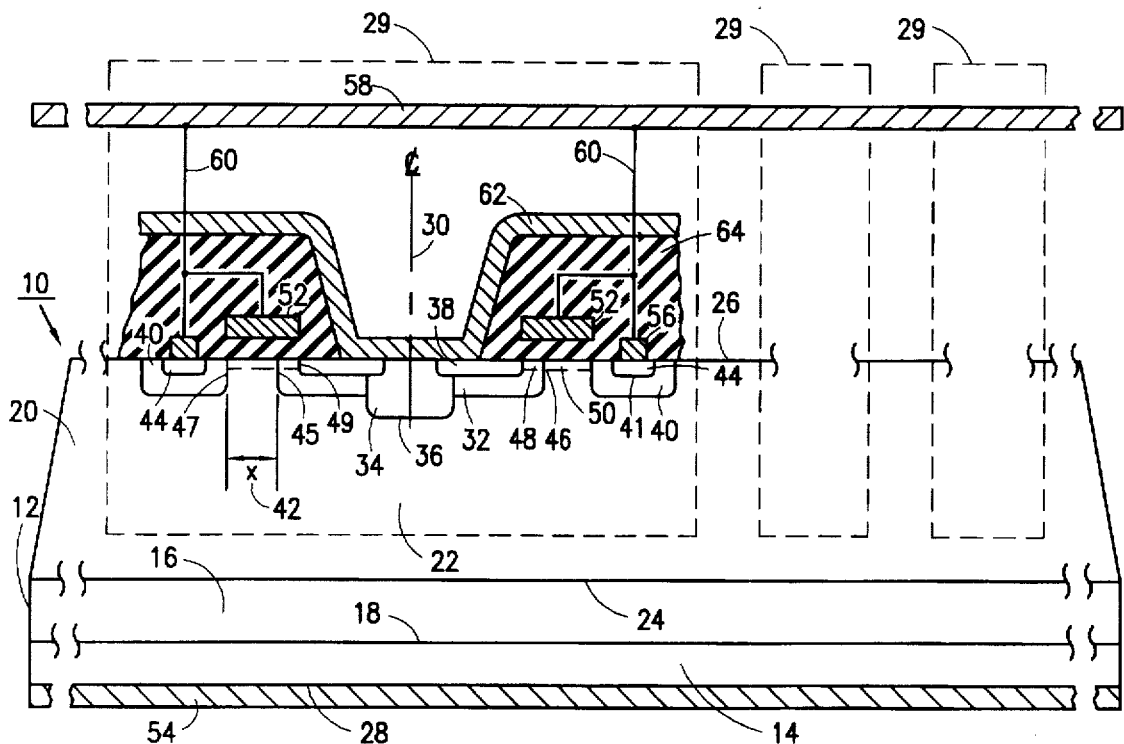
FIG. 1 is a cross-sectional view showing a typical cell of a power thyristor embodying one form of the invention.
Figure 2:
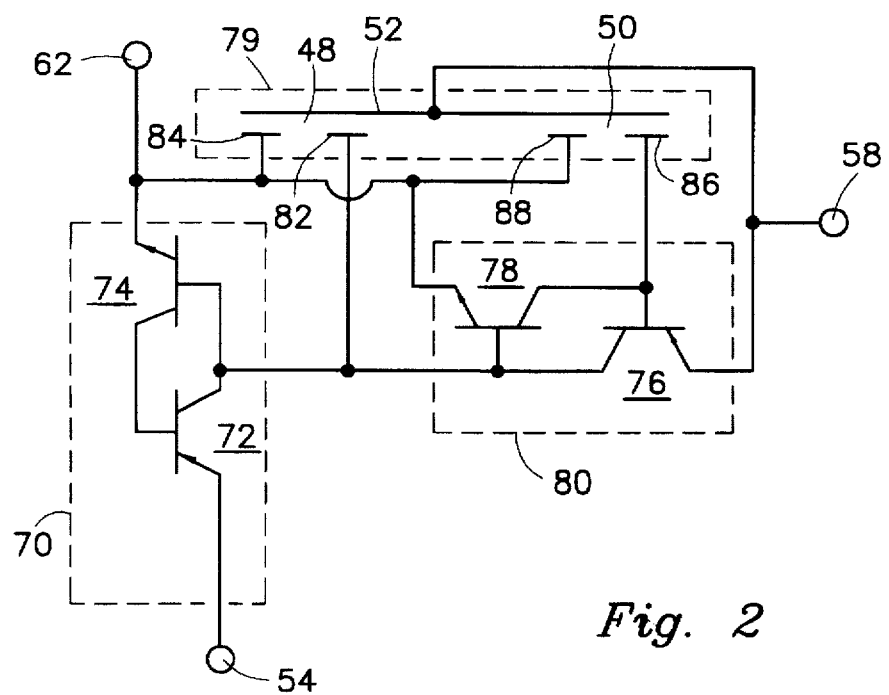
Figure 3:
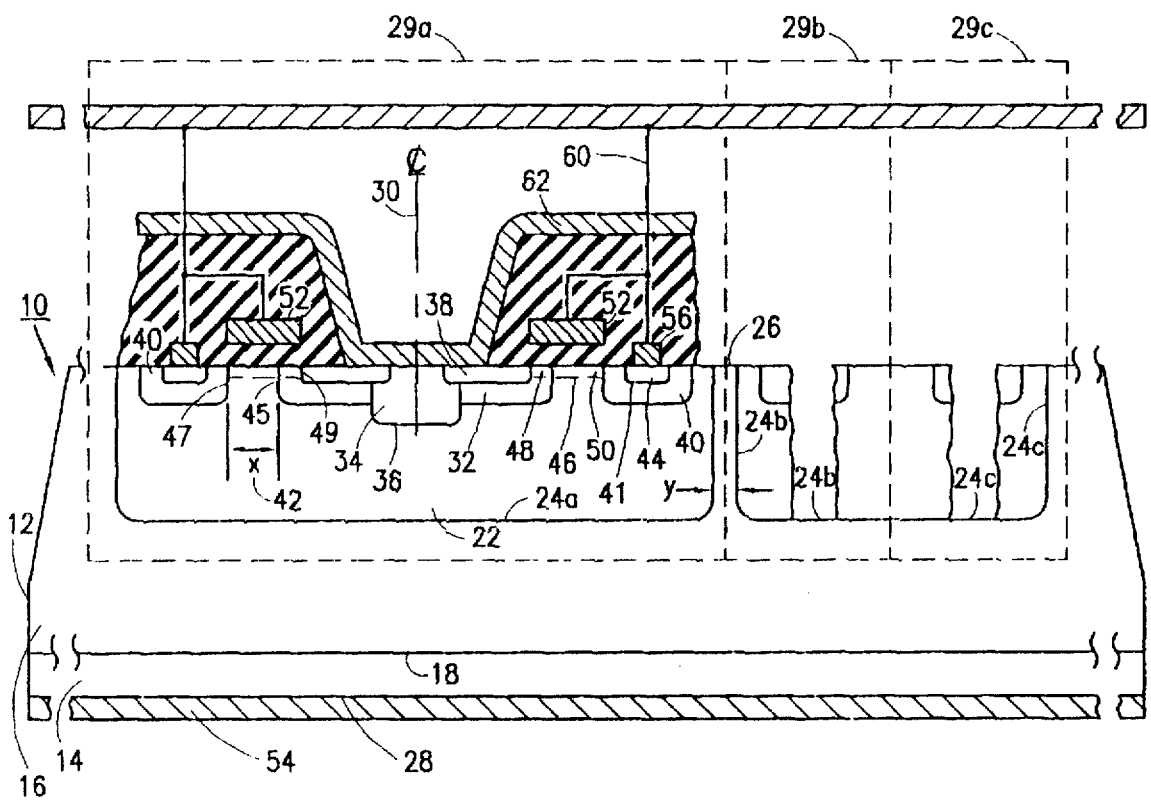

FIG. 2 is an equivalent circuit schematic of the thyristor cell illustrated in FIG. 1;

FIG. 3 is a cross-sectional view, partially in schematic form, illustrating another form of the invention.

DESCRIPTION OF PREFERRED EMBODIMENTS

For the sake of clarity, an element that is depicted in more than one figure may retain the same element number in each figure. Referring now to FIG. 1, there is shown a cross-section of a power thyristor 10 embodying one form of this invention. The thyristor 10 is formed in a silicon wafer 12 having a diameter of 53 millimeters and a thickness of 37 millimeters. A lower (P+) emitter region 14 having a maximum impurity concentration above about $10^{18}$ impurity atoms per cubic centimeter is formed in the bottom layer of the silicon wafer 12. Overlying the lower emitter region 14 across the entire plane of the silicon wafer 12 is a lower (N−) base region 16. This lower base region 16 has a maximum impurity concentration less than about $10^{15}$ impurity atoms per cubic centimeter. The intersection of the lower emitter region 14 with the lower base region 16 defines a p-n junction 18 that extends continuously across the entire plane of the silicon wafer 12. Initially, the upper layer 20 of the silicon wafer 12 is doped with (P) type material to have a concentration below about $10^{17}$ impurity atoms per cubic centimeter. The intersection of the upper layer 20 with the lower base region 16 also forms a p-n junction 24 that extends across the entire plane of the silicon wafer 12. An anode electrode 54 of the power thyristor 10 is electrically connected to the lower surface 28 of the silicon wafer 12. As will be described below, the remaining elements of the power thyristor 10, which include the upper emitter element and the turn-on and turn-off gate circuitry are formed as an array of identical cells 29. Each cell 29 is formed: (1) by modifying the impurity concentration in regions of the upper layer 20 immediately below the upper surface 26 of upper layer 20, and (2) by providing elements above and adjacent to the upper surface 26 of the silicon wafer 12. That portion of upper layer 20 that remains unmodified after formation of the cellular elements of power thyristor 10 forms the upper base (P) region 22 of the power thyristor 10.

In FIG. 1, only a single typical cell 29, which is symmetrical about the centerline 30, is illustrated. A first region 32, (N−) type, having a maximum impurity concentration below about $10^{17}$ impurity atoms per cubic centimeter extends from the upper surface 26 into the upper layer 20 of the silicon wafer 12. A second region 34, (N+) type, having a maximum impurity concentration in excess of about $10^{18}$ impurity atoms per cubic centimeter, forms an upper emitter 34 that extends from the upper surface 26 into and through the first region 32. The depth of penetration of the upper emitter 34 is limited to occur within the upper layer 20 and the intersection of this upper emitter 34 with the upper base 22 forms a p-n junction 36. The upper emitter region 34 is one of a plurality of similar emitter cells 29 of the power thyristor 10. A third region 38, (P+) type, having a maximum impurity concentration in excess of about $10^{18}$ impurity atoms per cubic centimeter extends from the upper surface 26 partially into the first region 32 and partially into the upper emitter region 34. A fourth region 40, (N) type, having a maximum impurity concentration below about $10^{17}$ impurity atoms per cubic centimeter extends from the upper surface 26 into the upper layer 20 of the silicon wafer 12. The edge 45 of the first region 32 is spaced a distance x, as indicated by two headed arrow 42, from the edge 47 of the fourth region 40. A fifth region 44, (P+) type, having a maximum impurity concentration in excess of about $10^{18}$ impurity atoms per cubic centimeter extends from the upper surface 26 of the silicon wafer 12 partially into the fourth region 40. The intersection of the fifth region 44 with the fourth region 40 forms a p-n junction 41. Looking down at the surface of the silicon wafer 12, the cell 29 can have any of a number of uniform shapes. For example, if the cell 29 has a circular shape, region 34 will have a more or less of a cylindrical shape and regions 32, 38, 40, and 44 will have an annular shape. Similarly, each cell can 29 have a square, hexagonal or some other shape. In those cases, the cross-section of FIG. 1 is representative of the cross-section in two or more directions.

The portion of the silicon wafer 12 between the upper surface 26 and dashed line 46 and extending from the edge 49 of third region 38 to the edge 45 of first region 32 defines a first channel 48. Similarly, the portion of the silicon wafer 12 between the upper surface 26 and dashed line 46 and extending from the edge 45 of the first region 32 to the edge 47 of the fourth region 40 defines a second channel 50. A FET gate element 52 spaced above the surface 26 of the silicon wafer 12 overlies both channels 48, 50. A metal contact representing the cathode 62 of the power thyristor 10 contacts the second region 34 and the third region 38 at the upper surface 26 of the silicon wafer 12. A metal contact 56 makes electrical contact with the fifth region 44 at the surface 26 of the silicon wafer 12. The metal contact 56, gate element 52 and gate electrode 58 are electrically connected as indicated by interconnection 60. An insulative medium 64, typically silicon dioxide, is located between the gate element 52 and the surface 26 of the silicon wafer 12 underlying the gate element 52.

FIG. 2 represents an equivalent circuit diagram of the structure depicted in FIG. 1. In FIG. 1, the main power-handling portion of the thyristor 10 consists of lower emitter 14, lower base 16, upper base 20 and upper emitter 34. In FIG. 2, the main power-handling portion of power thyristor 10 is shown in dashed block 70 as a pair of transistors 72, 74 connected as shown. Similarly, the structure depicted in FIG. 1 consisting of the fifth region (P+) 44, the fourth region (N) 40, the upper base region (P) 22 and the first region (N−) 32 is an auxiliary turn-on thyristor 80 that is connected to the cathode 62 by way of the second (N+) region 34. This auxiliary turn-on thyristor 80 is represented in FIG. 2 within the dashed box 80 as a pair of transistors 76, 78 connected as shown.

In FIG. 1, the MOS turn off-gate, which is integrated into the cell 29, consists of FET gate element 52 and first channel 48 which connects the upper base 22 to the third region 38 which makes electrical contact with cathode 62. In FIG. 2, the turn-off gate consists of gate element 52, source 82 connected to the base of transistor 74, drain 84 connected to the emitter of transistor 74, and channel 48 which connects the source 82 to the drain 84. In FIG. 1, the MOS turn-on gate, which is also integrated into cell 29, consists of FET gate element 52 and second channel 50 which connects the first region 32 to the fourth region 40. In FIG. 2, the turn-on gate consists of FET gate element 52, source 86 connected to the base of transistor 76, drain 88 connected to the emitter of transistors 78 and 74, and channel 50 which connects the source 86 to the drain 88.

A brief discussion of the turn-off and turn-on of power thyristor 10 now follows. Referring now to FIG. 1, assume that the power thyristor 10 is conducting current from anode 54 through lower emitter 14, lower base 16, upper base 22, upper emitter 34 to the cathode 62. To make the power thyristor 10 non-conductive, a negative voltage is applied to the gate electrode 58, and therefore to the FET gate element 52, which induces positive charge within the channel 48. This positive charge in the channel 48 provides a conductive path between the upper base 22 and the third region 38 in contact with the cathode 62. Some of the power thyristor 10 current that had been flowing across junction 36 to the cathode 62 begins flowing to the cathode 62 through the channel 48. Due to the relatively low impedance of channel region 48, the voltage across the upper emitter 34-upper base 22 junction 36 is reduced which causes the power thyristor 10 to eventually turn off.

If the power thyristor 10 is not conducting, applying a positive voltage to the gate electrode 58, and therefore to FET gate element 52 and contact 56, will cause the power thyristor 10 to turn on. The positive voltage on the gate element 52 induces negative charge to build up in the second channel 50 thereby providing a conductive current path between the fourth region 40 and the first region 32, which is electrically connected through the second region 34 to the cathode 62. That the current flow through the second channel 50 tends to turn on the power thyristor 10 is perhaps best explained with reference to FIG. 2. When a positive voltage is applied to the gate electrode 58, gate element 52 and the emitter of transistor 76, the second channel 50 becomes conductive thereby allowing base current to flow in the transistor 76, which turns transistor 76 on. When transistor 76 turns on, it provides base current drive for transistor 78, which turns the auxiliary thyristor 80 on, and also provides base current drive for transistor 74, which turns on the power thyristor 70.

In another aspect of the invention, the distance x, as represented by two-headed arrow 42, is controlled so that if the gate element 52 voltage exceeds a certain value, 30 volts for example, avalanche occurs from the edge 47 of fourth (N) region 40 to the edge 45 of first (N) region 32 thereby allowing current to flow from the gate element 52 to the cathode 62. This current flow also causes the auxiliary thyristor 80 and the power thyristor 10 to turn on. Besides providing an alternative method of turning on the power thyristor 10, it limits the voltage that can be applied across the insulative layer 64 in the event a higher voltage should happen to be applied to the gate electrode. For example, if the distance x is in the range of five to fifteen microns, the voltage across the insulative layer 64 will be limited to about 25 to 75 volts. This voltage limitation feature prevents damaging voltage levels from being inadvertently applied across the insulative layer 64.

FIG. 3 illustrates another aspect of this invention. Although in the embodiment of FIG. 1, the junction 24 formed by the intersection of the upper base 22 with the lower base 16 is continuous across the entire plane of the silicon wafer 12, it will be appreciated by those skilled in the art that the turn-on and turn-off gate structure of FIG. 1 can also be used when junction 24 is not continuous. Thus, in FIG. 3, the junction 18 formed by the intersection of lower emitter 14 with the lower base 16 extends across the plane of the silicon wafer 12, but cell 29a has its own upper base region 22 which extends down into the lower base region 16 from the upper surface 26 thereby forming a junction 24a that begins and ends at the upper surface 26 of the cell and, therefore, is not connected to the junction of an adjacent cell. FIG. 3 also shows that junction 24b of cell 29b has one end that terminates at upper surface 26 of cell 29b, but the other end is continuous with one end of junction 24c of cell 29c. The other end of junction 24c terminates at the upper surface 26 of cell 29c. It will be appreciated by those skilled in the art that if the spacing Y between the junction 24a of cell 29a and the junction 24b of an adjacent cell 29b is very small (for example between three to five microns), the power thyristor 10 will function as though the p-n junction 24 is continuous between cell 29a and cell 29b. By maintaining the spacing Y at three to five microns throughout the array, the discontinuous junction 24 will function as though it is continuous across the silicon wafer 12. All of the remaining elements in FIG. 5 of the power thyristor 10 have the same relationship to the upper base region 22 as they do in FIG. 1.

While we have shown and described particular embodiments of our invention, it will be obvious to those skilled in the art that various changes and modifications may be made without departing from our invention in its broader aspects; and we, therefore, intend herein to cover all such changes and modifications as fall within the true spirit and scope of our invention.

What is claimed as new and desired to be secured by Letters Patent of the United States is:

1. A power thyristor (10) having first and second power electrodes (54, 62), a single gate electrode (58) and a thyristor body (12) comprising overlying first, second, and third layers (14, 16, 20) of semiconductor material wherein the first and third layers (14, 20) are of one conductivity type and the second layer (16) is of an opposite conductivity type, a surface (28) of the first layer (14) opposite the overlying second layer (16) forming a first major surface (28) of the thyristor body (12) and being connected to the first power electrode (54), a surface (26) of the third layer (20) opposite the underlying second layer (16) forming a second major surface (26) of the thyristor body (12), said thyristor (10) having a plurality of cells each comprising:

(a) a first region (32) having a low impurity concentration of said opposite conductivity type extending from the second major surface (26) into the third layer (20);

(b) a second region (34) having a high impurity concentration of said opposite conductivity type extending from the second major surface (26) partially into and through the first region (32) and into the third layer (20), and being connected to the second power electrode (62);

(c) a third region (38) connected to the second power electrode (62) having an impurity concentration of said one conductivity type extending from the second major surface (26) partially into the first and second regions (32, 34);

(d) a fourth region (40) having a low impurity concentration of said opposite conductivity type extending from the second major surface (26) into the third layer (20), the fourth region (40) being spaced apart from the first region (32) to define at the second major surface (26) a channel (50) in the third layer (20) between the first region (32) and the fourth region (40);

(e) a fifth region (44) having an impurity concentration of said one conductivity type extending from the second major surface (26) into the fourth region (40) to form a p-n junction (41) within the fourth region (40); and (f) a gate element (52) connected to the gate electrode (58) and to the fifth region (44), and spaced from and overlying the channel (50), means for applying a voltage of one polarity to the gate element (52) for forward-biasing said p-n junction (41) and causing the channel (50) to become conductive thereby providing a low impedance path between the fifth region (44) and the second power electrode (62) which allows current to flow between the gate electrode (58) and the power electrode (62) and through the second region (34) and third layer (20) for turning on the power thyristor (10).

2. A power thyristor (10) as recited in claim 1 wherein the third and fifth regions (38, 44) have a high impurity concentration of said one conductivity type.

3. A power thyristor (10) as recited in claim 1, wherein the spacing (42) between the first region (32) and the fourth region (40) is about five to fifteen microns and of such value that when the voltage applied to the gate electrode (58) exceeds a predetermined value, avalanching occurs between the first (32) and fourth region (40) which turns on the power thyristor (10) and limits the voltage at the gate electrode (58) to a level that protects from damage the insulation between said gate element (52) and said second major surface (26).

4. A power thyristor (10) having first and second power electrodes (54, 62), a single gate electrode (58) and a thyristor body (12) comprising overlying first, second, and third layers (14, 16, 20) of semiconductor material wherein the first and third layers (14, 20) are of one conductivity type and the second layer (16) is of an opposite conductivity type, a surface (28) of the first layer (14) opposite the overlying second layer (16) forming a first major surface (28) of the thyristor body (12) and being connected to the first power electrode (54), a surface (26) of the third layer (20) opposite the underlying second layer (16) forming a second major surface (26) of the thyristor body (12), said thyristor (10) having a plurality of cells each comprising:

(a) a first region (32) having a low impurity concentration of said opposite conductivity type extending from the second major surface (26) into the third layer (20);

(b) a second region (34) having a high impurity concentration of said opposite conductivity type extending from the second major surface (26) partially into and through the first region (32) and into the third layer (20), and being connected to the second power electrode (62);

(c) a third region (38) connected to the second power electrode (62) having an impurity concentration of said one conductivity type extending from the second major surface (26) partially into the first and second regions (32, 34) so as to define at the second major surface (26) a first channel (48) in the first region (32) adjacent to the third region (38);

(d) a fourth region (40) having a low impurity concentration of said opposite conductivity type extending from the second major surface (26) into the third layer (20), the fourth region (40) being spaced apart from the first region (32) to define at the second major surface (26) a second channel (50) in the third layer 20 between the first region 32 and the fourth region (40);

(e) a fifth region (44) having an impurity concentration of said one conductivity type extending from the second major surface (26) into the fourth region (40) to form a p-n junction (41) within the fourth region (40); and (f) a gate element (52) connected to the gate electrode (58) and to the fifth region (44), and spaced from and overlying the first and second channels (48, 50), means for applying (i) a voltage of one polarity to the gate element (52) for causing the first channel (48) to become conductive thereby providing a low impedance path between the third layer (20) and the second power electrode (62) for turning off the power thyristor 10 and (ii) a voltage of the opposite polarity to the gate element (52) for forward-biasing said p-n junction (41) and causing the second channel (50) to become conductive thereby providing a low impedance path between the fifth region (44) and the second power electrode (62) which allows current to flow between the gate electrode

(58) and the second power electrode (62) and through the third layer (20) and the second region (34) which turns on the power 65 thyristor (10).

5. A power thyristor (10) as recited in claim 4 wherein the third and fifth regions (38, 44) have a high impurity concentration of said one conductivity type.

6. A power thyristor (10) as recited in claim 4, wherein the spacing (42) between the first region (32) and the fourth region (40) is about five to fifteen microns and of such value that when the voltage applied to the gate electrode (58) exceeds a predetermined value, avalanching occurs between the first (32) and fourth region (40) which turns on the power thyristor (10) and limits the voltage at the gate electrode (58) to a level that protects from damage the insulation between said gate element (52) and said second major surface 26.

7. A power thyristor (10) having first and second power electrodes (54, 62), a single gate electrode (58) and a thyristor body (12) comprising overlying first and second layers (14, 16) of semiconductor material wherein the first layer (14) is of one conductivity type and the second layer (16) is of an opposite conductivity type, a surface (28) of the first layer (14) opposite the overlying second layer (16) forming a first major surface (28) of the thyristor body (12) and being connected to the first power electrode (54), a surface (26) of the second layer (16) opposite the underlying first layer (14) forming a second major surface (26) of the thyristor body (12), said thyristor (10) having a plurality of cells each comprising:

(a) an upper base region (22) of said one conductivity type extending from the second major surface (26) into the second layer (16) to form a p-n junction (24) with said second layer that terminates at said second major surface (26) of the thyristor body (12);

(b) a first region (32) having a low impurity concentration of said opposite conductivity type extending from the second major surface (26) into the upper base region (22);

(c) a second region (34) having a high impurity concentration of said opposite conductivity type extending from the second major surface (26) partially into and through the first region (32) and into the upper base region (22), and being connected to the second power electrode (62);

(d) a third region (38) connected to the second power electrode (62) having a high impurity concentration of said one conductivity type extending from the second major surface (26) partially into the first and second regions (32, 34) so as to define at the second major surface (26) a first channel (48) in the first region (32) adjacent to the third region (38);

(e) a fourth region (40) having a low impurity concentration of said opposite conductivity type extending from the second major surface (26) into the upper base region (22), the fourth region (40) being spaced apart from the first region (32) to define at the second major surface (26) a second channel (50) in the in the upper base region (22) between the first region (32) and the fourth region (40);

(f) a fifth region (44) having a high impurity concentration of said one conductivity type extending from the second major surface (26) into the fourth region (40) to form a p-n junction (41) within the fourth region (40); and (g) a gate element (52) connected to the gate electrode (58) and to the fifth region (44), and spaced from and overlying the channel (50), means for applying a voltage of one polarity to the gate element (52) for forward-biasing said p-n junction (41) and causing the channel (50) to become conductive thereby providing a low impedance path between the fifth region (44) and the second power electrode (62) which allows current to flow between the gate electrode (58) and the power electrode (62) and through the second region (34) and third layer (20) for turning on the power thyristor (10).

8. A power thyristor (10) as recited in claim 7 wherein the third and fifth regions (38, 44) have a high impurity concentration of said one conductivity type.

9. A power thyristor (10) as recited in claim 8 wherein a p-n junction (24a) is formed between said second layer and upper base region of one cell and spaced about three to five microns from a corresponding p-n junction (24b) of an adjacent cell and sufficiently close thereto to cause the junctions between cells to function as part of a continuous junction across the thyristor body.

* * * * *

UNITED STATES PATENT AND TRADEMARK OFFICE
CERTIFICATE OF CORRECTION

PATENT NO. : 5,757,037
DATED      : May 26, 1998
INVENTOR(S): Dante E. Piccone and Harshad Mehta It is certified that error appears in the above—identified patent and that said Letters Patent is hereby corrected as shown below:

In Column 8, line 31, cancel "third layer (20)" and substitute therefor -- second layer (16) --

Signed and Sealed this

Fifteenth Day of December, 1998

Attest:

Attesting Officer

BRUCE LEHMAN

Commissioner of Patents and Trademarks